(12) United States Patent
Cho et al.

(10) Patent No.: US 7,807,996 B2
(45) Date of Patent: Oct. 5, 2010

(54) TEST PATTERN OF CMOS IMAGE SENSOR AND METHOD OF MEASURING PROCESS MANAGEMENT USING THE SAME

(75) Inventors: Eun Sang Cho, Seoul (KR); Kee Ho Kim, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 802 days.

(21) Appl. No.: 11/545,462

(22) Filed: Oct. 11, 2006

(65) Prior Publication Data

US 2007/0080347 A1   Apr. 12, 2007

(30) Foreign Application Priority Data

Oct. 11, 2005   (KR) .................... 10-2005-0095424

(51) Int. Cl.
*H01L 23/58*   (2006.01)
(52) U.S. Cl. ................. 257/48; 438/14; 438/16; 257/294; 257/E33.076
(58) Field of Classification Search ............ 257/48
See application file for complete search history.

(56) References Cited

U.S. PATENT DOCUMENTS

| | | | |
|---|---|---|---|
| 5,450,205 A * | 9/1995 | Sawin et al. ............... 356/632 |
| 6,664,121 B2 * | 12/2003 | Grodnensky et al. .......... 438/16 |
| 2001/0003446 A1 * | 6/2001 | Takafuji ..................... 345/98 |
| 2004/0241899 A1 * | 12/2004 | Brissot et al. ................ 438/73 |
| 2005/0274871 A1 * | 12/2005 | Li et al. .................... 250/208.1 |
| 2006/0000964 A1 * | 1/2006 | Ye et al. ................... 250/208.1 |
| 2006/0138488 A1 * | 6/2006 | Kim ......................... 257/292 |

* cited by examiner

*Primary Examiner*—Thao X Le
*Assistant Examiner*—Ajay K Arora
(74) *Attorney, Agent, or Firm*—Lowe Hauptman Ham & Berner LLP

(57) ABSTRACT

The test pattern according to the present invention consists of an opaque metal film pattern formed on a semiconductor substrate, an insulating film formed on the semiconductor substrate and the metal film pattern, a red color filter formed on the insulating film, a planarization layer formed on the insulating film and the red color filter, and a number of micro-lenses formed on the planarization layer.

8 Claims, 2 Drawing Sheets

TEST PATTERN OF CMOS IMAGE SENSOR AND METHOD OF MEASURING PROCESS MANAGEMENT USING THE SAME

FIELD OF THE INVENTION

The present invention relates to an image sensor, and, in particular, a test pattern of a CMOS image sensor measuring process management of a micro-lens and a color filter using optical critical dimension (OCD), and a method of measuring process management using the same.

BACKGROUND OF THE INVENTION

Generally, an image sensor is a semiconductor device that converts an optic image to an electrical signal. An image sensor is usually an array of charge coupled devices (CCD) or complementary metal-oxide-semiconductor (CMOS) image sensors. In CCD sensors, individual metal-oxide-semiconductor (MOS) capacitors are positioned very close to one another, and charge carriers to be transferred are stored in each of the capacitors. In the CMOS image sensor, the same number of MOS transistors as the number of pixels are formed by CMOS technology using a control circuit and a signal processing circuit as peripheral circuits, and the transistors are switched for sequentially detecting outputs.

CCD sensors have several drawbacks such as their complicated driving methodology, large power consumption, and complicated manufacturing process due to the many mask steps. Furthermore, it is hard to manufacture the CCD as a single chip because a signal processing circuit cannot be embodied in the CCD chip. To overcome the aforementioned problems, research is being directed towards developing the CMOS image sensor using sub-micron CMOS fabrication technology.

In the CMOS image sensor, a photodiode and a MOS transistor are formed in a unit pixel. An image is shown on the CMOS image sensors, each of which sequentially detects signals. Since the CMOS image sensor adopts the CMOS manufacturing technology, power consumption is low. Furthermore, since the number of masks is about 20, the manufacturing process of the CMOS image sensor is very simple, compared to the CCD manufacturing process that needs about 30-40 masks. Furthermore, the CMOS image sensor can be embodied in one chip together with other signal progressing circuits. Due to these reasons, the CMOS image sensor is believed to be the next generation image sensor.

On the other hand, the sensitivity of a CMOS image sensor, one of the most important factors determining its operational characteristics, is defined as the level of signal (voltage) generated by the sensor versus the unit intensity of radiation (lux) being input. The sensitivity is denoted as either mV/lx·s or V/lx·s.

The sensitivity indicates the amount of increase in the output signal (mV) as the intensity of light increases by 1 lux. When the sensitivity is high, the image is more visible even in a dark environment.

Also, higher sensitivity means higher output signal level, which in turn leads to a higher S/N ratio. Two factors determining the sensitivity are optical efficiency and electrical efficiency. A major factor to enhance the optical efficiency is to optimally concentrate external light on a photodiode, that is, to set up appropriate process conditions by operatively associating the thickness and material of an interlayer insulating layer, i.e., the inter metal dielectric (IMD), and the thickness, diameter, material and shape of a micro-lens.

Furthermore, a major method to maximize the electrical efficiency is to optimize a doping profile of a P-N junction so that the light entering the photodiode generates electron-hole pairs to its maximum level at an effective portion. Furthermore, based on the relationship $\Delta Q = C \Delta V$ ($\Delta Q$ is increment in charge, C is capacitance, and $\Delta V$ is increment in voltage), the capacitance of the capacitor that is used where the signal charges are converted to the signal voltage is sought to be reduced.

The optical efficiency is secured by the process conditions, and the electrical efficiency is determined by the device design.

On the other hand, a general CMOS image sensor simply includes a photodiode, an interlayer insulating layer, a color filter, a micro-lens, and the like.

The photodiode senses light and converts it into an electrical signal. The interlayer insulating layer insulates metal wires from each other. The color filter displays red, green and blue of the light. The micro-lens concentrates the light onto the photodiode.

Among the above, the least-standardized process is the manufacturing process of the micro-lens.

The micro-lens is made of a transparent photoresist material having a gentle oval shape.

According to current semiconductor fabrication technology, a micro-lens in an oval shape is generally manufactured through the exposure and development process using a photoresist and a reflow process.

However, it is hard to standardize the reflow process, and the photoresist used for manufacturing the micro-lens is very sensitive to the reflow process. Accordingly, it is very difficult to improve process stability.

Accurate measurement is thus required for the process standardization. Generally, in a production line, an artificially generated pattern is measured using a critical dimension scanning electron microscopy (CDSEM).

However, in the CMOS image sensor, it is impossible to accurately measure the critical dimension (CD) and thickness of the micro-lens and the color filter.

FIG. 1 is a cross-sectional view illustrating a typical CMOS image sensor.

As illustrated in FIG. 1, the typical CMOS image sensor includes: one or more photodiode regions 31 which generate current according to the intensity of radiation being incident and which are formed on a semiconductor substrate (not shown); an interlayer insulating layer 32 formed on the semiconductor substrate and the photodiode regions 31; a protective layer 33 formed on the interlayer insulating layer 32; a red, green and blue (RGB) color filter layer 34 transmitting light having each specific wavelength and formed on the protective layer 33; a planarization layer 35 formed on the color filter layer 34; and micro-lenses 36 formed on the planarization layer 35, each micro-lens being in a convex shape with a curvature, transmitting through the color filter layer 34, and concentrating light on the photodiode regions 31.

In the typical CMOS image sensor, an optical shielding layer (not shown) is formed in the interlayer insulating layer 32 and prevents the light from being incident on the portions outside the photodiode regions 31.

In the above-described CMOS image sensor, the micro-lens 36 is transparent and has a shape of flat semi-sphere. Each of red, green and blue of the color filter layer 34 is positioned under each micro-lens 36 and planarization layer 35.

The measurement equipment required for the above-described CMOS image sensor shall meet the following characteristics.

First, the measurement equipment shall be capable of measuring the horizontal and vertical dimensions simultaneously.

Since the shapes of the planarization layer 35 and microlens 36 formed on the color filter layer 34 vary depending on the shape (the respective thicknesses) of the R, G and B color filter layer 34, simultaneous measurement is required.

Second, the measurement equipment shall be capable of obtaining a large amount of data at once.

Generally, one die includes several millions of micro-lens i.e., one die includes 1,300,000 micro-lens in a 1.3 megapixel sensor). Thus, automatic measurement equipment is needed for a large amount of data.

Third, the measurement shall be performed by a non-destructive method. The measurement equipment shall directly observe and measure the process management of the CMOS image sensor in the production line.

Accordingly, a CDSEM with the above-described characteristics has been used for measuring the process management of the micro-lens and color filter in a conventional CMOS image sensor. The merit and demerit of the CDSEM is that it can obtain only surface information.

Another method for measuring the process management of the micro-lens and color filter in a CMOS image sensor is performed by the measurement equipment using an optic that measures thickness.

In the equipment for measuring thickness, a light source focusing diameter is usually very large. Thus, such equipment is not suitable for measuring a small pattern, unlike the CDSEM.

The cross-section scanning electron microscopy (X-SEM), which is the most common methodology to measure the vertical dimension, uses a destructive method. Thus, it is not suitable for continuous process management of the micro-lens and color filter.

SUMMARY OF THE INVENTION

It is, therefore, an object of the present invention to provide a test pattern of a CMOS image sensor, in which process management of a micro-lens and a color filter is measured using optical critical dimension (OCD), and a method of measuring process management using the test pattern.

In accordance with a preferred embodiment of the present invention, there is provided a test pattern of a CMOS image sensor, comprising: an opaque metal film pattern formed on a semiconductor substrate; an insulating film formed on the entire surface of the semiconductor substrate including the metal film pattern; a red color filter formed on the insulating film; a planarization layer formed on the entire surface of the semiconductor substrate including the red color filter; and a number of micro-lenses formed on the planarization layer.

In accordance with another preferred embodiment of the present invention, there is provided a method of measuring process management of a CMOS image sensor, and the method comprises forming a test pattern of a CMOS image sensor, which comprises an opaque metal film pattern formed on a semiconductor substrate, an insulating film formed on the entire surface of the semiconductor substrate including the metal film pattern, a red color filter formed on the insulating film, a planarization layer formed on the entire surface of the semiconductor substrate including the red color filter, and a number of micro-lenses formed on the planarization layer; and regularly scanning the test pattern at various angels using a light source of short wavelength, detecting a scattered beam, and measuring the process management of the micro-lenses and color filter.

In accordance with still another preferred embodiment of the present invention, there is provided a method of forming a test pattern of a CMOS image sensor, and the method comprises forming an opaque metal film pattern on a semiconductor substrate, forming an insulating film on the the semiconductor substrate and the metal film pattern, forming a single-color filter on the insulating film, forming a planarization layer on the insulating film and the single-color filter, and forming a plurality of micro-lenses on the planarization layer.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Hereinafter, preferred embodiments of the present invention will be described in detail with reference to the accompanying drawings so that they can be readily implemented by those skilled in the art.

Figure 1:
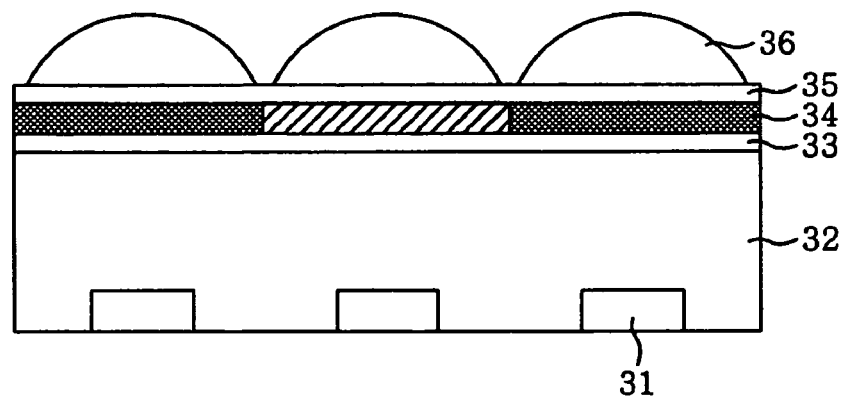
FIG. 1 is a cross-sectional view illustrating a typical CMOS image sensor.
Figure 2:
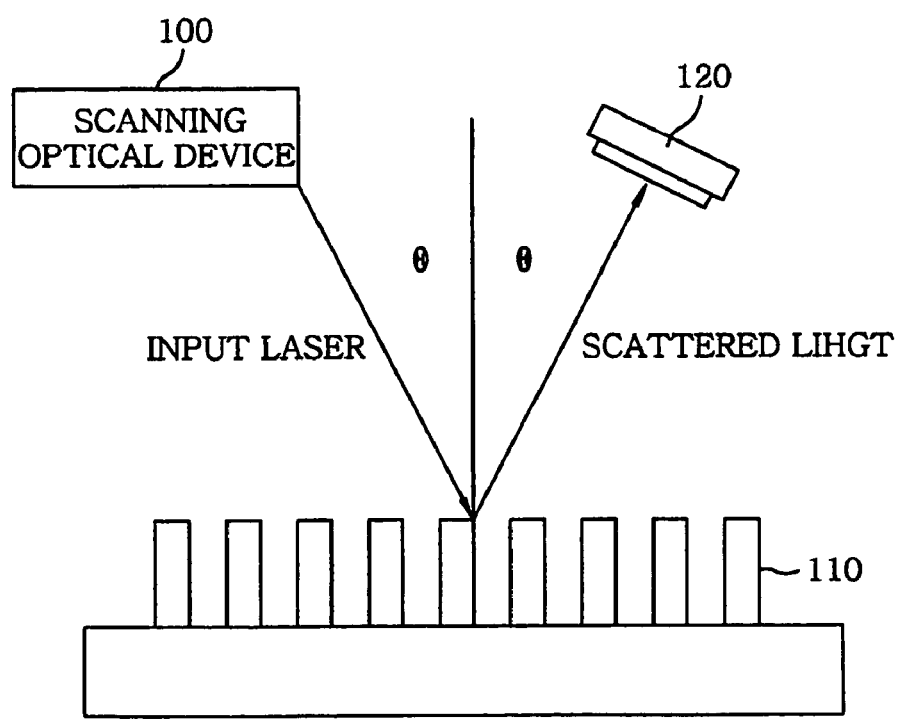
FIG. 2 is a conceptual view illustrating optical critical dimension (OCD) for measuring process management of a CMOS image sensor in accordance with an embodiment of the present invention.

FIG. 2 is a conceptual view of an optical critical dimension (OCD) for measuring process management of a CMOS image sensor in accordance with the present invention.

As illustrated in FIG. 2, a scanning optical system 100 scans patterns 110, which are regularly arranged, at different angles (−47° to 47°) using a light source of short wavelength. Generally, a helium (He)-neon (Ne) laser (632.8 nm) is used. A photo detector 120 detects the S component and P component of a polarized beam by scanning.

Thereafter, by comparing it with a library which contains various information on the films, information on horizontal and vertical dimensions is obtained.

However, due to the characteristics of the OCD, it is difficult to obtain accurate data by the OCD process using a general test pattern for the process management of a micro-lens and color filter layer.

That is, since all films from the micro-lens to the photodiodes are transparent, the obtained beam includes too much information. Consequently, it would take too much time to compare it with the library, and thus the OCD measurement of a general test pattern for the process management of the micro-lens and the color filter is not appropriate for a real-time measurement.

In consideration of the above, the present invention provides a method for measuring process management of a micro-lens and a color filter of a CMOS image sensor, in which a new measurement pattern considering the characteristics of the OCD is presented.

Figure 3:
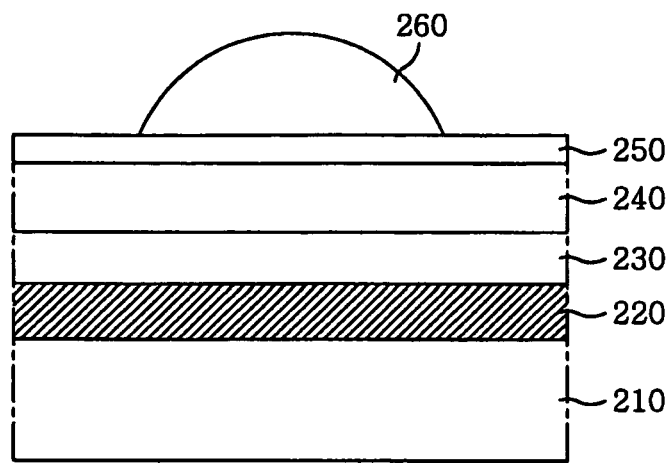
FIG. 3 is a cross-sectional view illustrating a test pattern of a CMOS image sensor for the OCD measurement in accordance with the present invention.

FIG. 3 is a cross-sectional view illustrating a test pattern of a CMOS image sensor for OCD measurement in accordance with the present invention.

As illustrated in FIG. 3, the test pattern comprises a metal film pattern 220 composed of an opaque metal (for example, Al or Cu) and formed on a semiconductor substrate 210; an insulating film 230, such as undoped silicate glass (USG) formed on the semiconductor substrate 210 and the metal film pattern 220; a red color filter layer 240 formed on the insulating film 230; a planarization layer 250 formed on the insulating film 230 and the red color filter layer 240; and a plurality of micro-lenses 260 formed on the planarization layer 250.

Only 632.8 nm light is used as described above for the above-described OCD measurement. Thus, when green or blue color filters are used, wrong signals may be obtained. For this reason, the red color filter layer 240 is used in the test pattern of FIG. 3. Although the present invention considers the OCD measurement, the present invention may be also applicable to other measurements that use wavelengths other than 632.8 nm by utilizing color filters other than red filters.

The test pattern may further comprise a silicon nitride (SiN) between the insulating film 230 and the red color filter layer 240.

Figure 4:
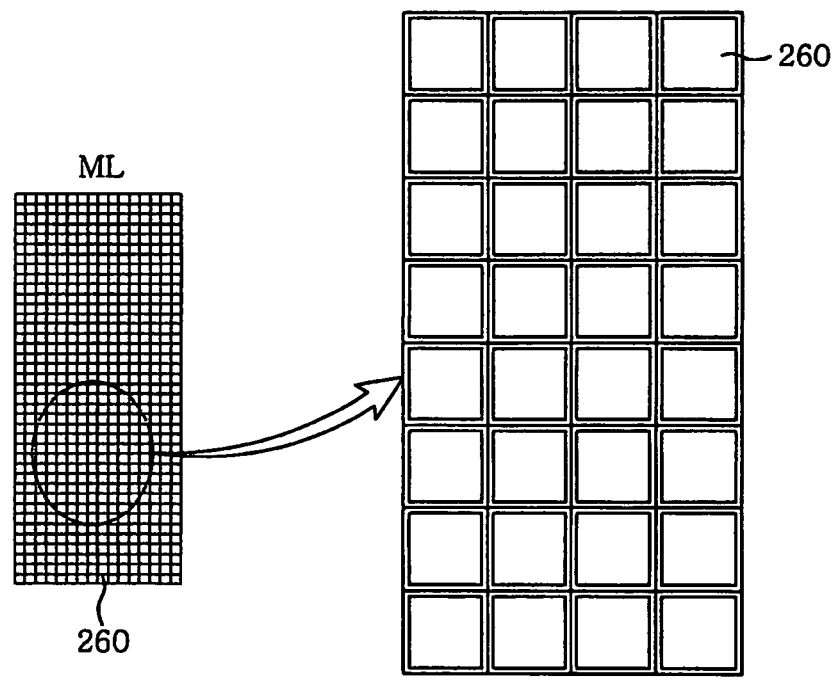
FIG. 4 is a top view illustrating the test pattern of the CMOS image sensor in FIG. 3.

FIG. 4 is a top view of the test pattern of FIG. 3.

As illustrated in FIG. 4, one die includes several millions of micro-lenses 260, thereby obtaining a large amount of data.

The process management of the micro-lenses and the color filter layer is measured, applying the OCD to the test pattern described above.

The test pattern of a CMOS image sensor and the method of measuring process management using the test pattern in accordance with the present invention have the effect that the sensitivity being most critical among the characteristics of a CMOS image sensor is managed (a S/N ratio, and a fixed focus length by simulation), by tightly managing the process management of the micro-lenses and color filter which is very difficult among the entire processes of a CMOS image sensor. Further, when the characteristics of the sensitivity are changed, the cause of the change is accurately understood.

While the invention has been shown and described with respect to the preferred embodiments, it will be understood by those skilled in the art that various changes and modifications may be made without departing from the spirit and scope of the invention as defined in the following claims.

What is claimed is:

1. A method of measuring process management of the fabrication of a CMOS image sensor, comprising:
   forming a test pattern of a CMOS image sensor, wherein the test pattern comprises an opaque metal film pattern formed on a semiconductor substrate, an insulating film formed on the semiconductor substrate and the metal film pattern, a single-color filter formed on the insulating film, the single-color filter being only a red color filter, a planarization layer formed on the insulating film and the single-color filter, and a number of micro-lenses formed on the planarization layer; and
   scanning the test pattern at a plurality of angles using a light source of short wavelength, detecting a scattered beam, and measuring the process management of the micro-lenses and the color filter.

2. The method of claim 1, wherein the light source of short wavelength is a helium (He)-neon (Ne) laser.

3. The method of claim 1, wherein the angle is incident to the surface of the test pattern within the range of −47° to 47°.

4. The method of claim 1, wherein the insulating film includes undoped silicate glass.

5. A method for forming a test pattern of a CMOS image sensor, comprising:
   forming an opaque metal film pattern on a semiconductor substrate;
   forming an insulating film on the semiconductor substrate and the metal film pattern;
   forming a single-color filter on the insulating film, the single-color filter being only a red color filter;
   forming a planarization layer on the insulating film and the single-color filter; and
   forming a plurality of micro-lenses on the planarization layer.

6. The method of claim 5, wherein the metal film pattern is composed of aluminum or copper.

7. The method of claim 5, wherein the insulating film includes undoped silicate glass.

8. The method of claim 5, wherein the test pattern further comprises silicon nitride (SiN) between the insulating film and the single-color filter.

* * * * *